United States Patent [19]
Mizoguti et al.

[11] Patent Number: 5,970,317
[45] Date of Patent: Oct. 19, 1999

[54] METHOD OF FORMING A FILTER FOR A SOLID-STATE IMAGE SENSING DEVICE

[75] Inventors: Hiroaki Mizoguti; Syunji Horiuchi; Youichi Hirotani; Yukihiro Sayama, all of Kagoshima, Japan

[73] Assignee: Sony Corporation, Tokyo, Japan

[21] Appl. No.: 09/084,169

[22] Filed: May 26, 1998

[30] Foreign Application Priority Data

May 27, 1997 [JP] Japan ................................. 9-136772

[51] Int. Cl.$^6$ ............................................. H01L 27/148
[52] U.S. Cl. ............................ 438/70; 438/75; 257/432; 257/440
[58] Field of Search ............................. 438/60, 70, 75, 438/35; 257/232, 233, 432, 440, 59; 430/7, 270.6

[56] References Cited

U.S. PATENT DOCUMENTS

| | | | |
|---|---|---|---|
| 5,028,547 | 7/1991 | Iizuka et al. | 438/70 |
| 5,479,049 | 12/1995 | Aoki et al. | 257/232 |
| 5,493,143 | 2/1996 | Hokari | 257/232 |
| 5,514,888 | 5/1996 | Sano et al. | 257/232 |
| 5,654,202 | 8/1997 | Daly et al. | 438/70 |
| 5,695,911 | 12/1997 | Itoh et al. | 430/270.6 |
| 5,739,548 | 4/1998 | Shigeta et al. | 257/59 |
| 5,766,980 | 6/1998 | Ohtagaki | 438/35 |
| 5,800,952 | 9/1998 | Urano et al. | 430/7 |
| 5,877,040 | 3/1999 | Park et al. | 438/70 |

*Primary Examiner*—Olik Chaudhuri
*Assistant Examiner*—Anh Duy Mai
*Attorney, Agent, or Firm*—Hill & Simpson

[57] ABSTRACT

In a method of forming a color filter for use in a solid-state image sensing device forming a color filter made of a resist material on a planarized layer made of a thermosetting resin formed on the surface of a solid-state image sensing device, a temperature for the heat treatment upon forming the color filter is defined as equal to or higher than 205° C. and less than 220° C., so that occurrence of micro-cracks in the planarized layer made of the thermosetting resin can be prevented.

4 Claims, 3 Drawing Sheets

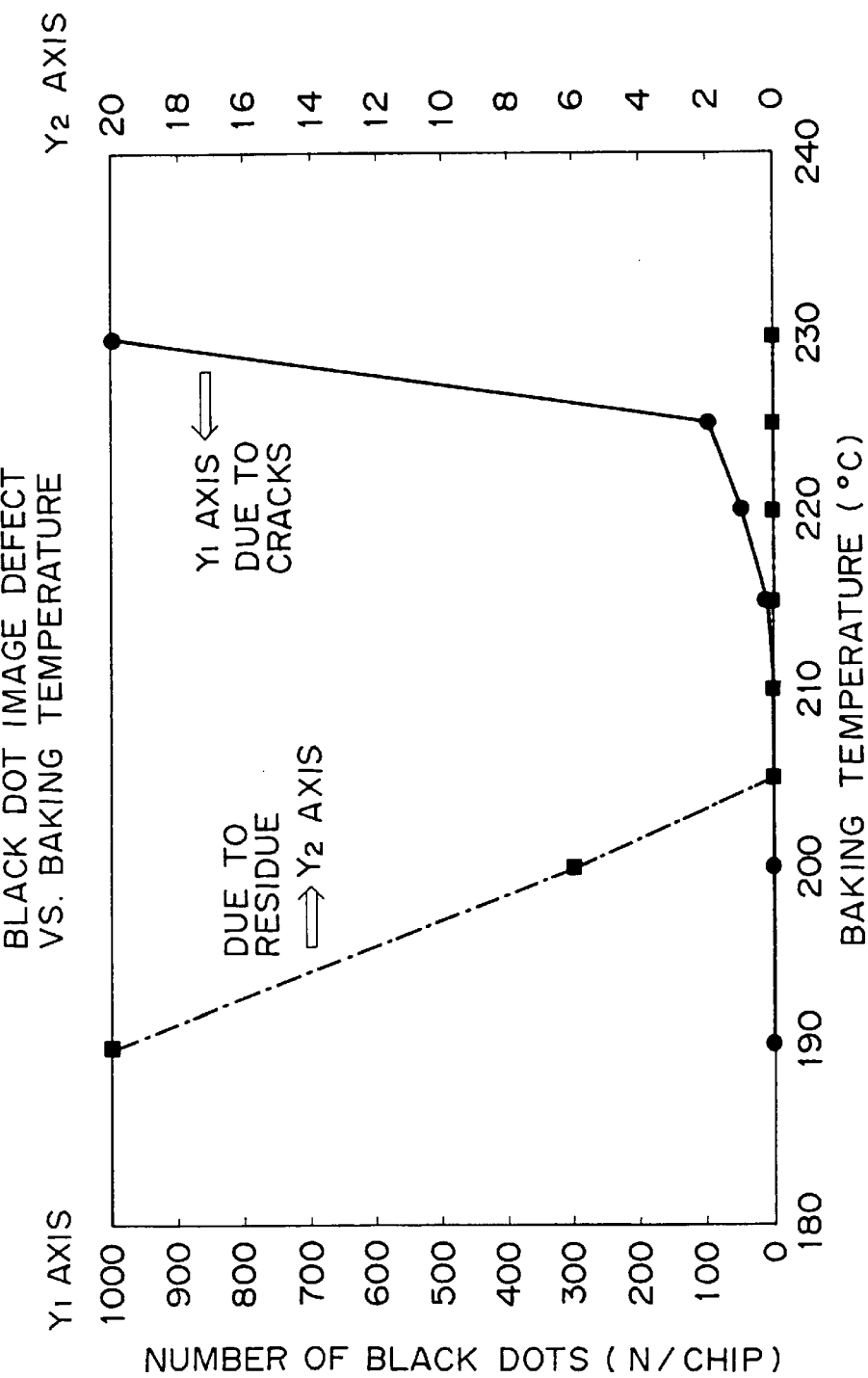

METHOD OF FORMING A FILTER FOR A SOLID-STATE IMAGE SENSING DEVICE

BACKGROUND OF THE INVENTION

1. Field of the Invention

The present invention concerns a method of forming a color filter for a solid-state image sensing device having on-chip color filter and, more in particular, it relates to a method of forming a color filter used in a solid-state image sensing device for forming a color filter made of a resist material on a planarized layer comprising a thermosetting resin formed on the surface of the solid-state image sensing device.

2. Description of the Related Art

A solid-state image sensing device includes such a device having a color filter formed on the surface of a solid-state image sensing device. Since the solid-state image sensing device has a remarkable surface unevenness, a planarized layer comprising a thermosetting resin is generally formed on the surface of the solid-state image sensing device and then the color filter is formed on the planarized layer. A resist material is often used for the material of the color filter. That is, the color filter is formed by coating a resist, applying exposure and development and then applying a heat treatment at a predetermined temperature for improving the adhesion with the underlying layer.

By the way, in the prior art, micro-cracks are often formed in a planarized layer made of the thermosetting resin in the solid-state image sensing device. Such micro-cracks cause deterioration of optical image sensing characteristics of the solid-state image sensing device. Such micro-cracks include those giving disadvantages in the initial stage and those resulting in disadvantages as an aging effect and both of them are innegligible since they deteriorate the characteristics of the solid-state image sensing device. Actually, failures caused by the cracks in the planarized layer have been generated so far at a rate as high as from 40 to 80%.

In view of the above, the present inventor has investigated the cause of the cracks, and has been found that thermal stresses induced by a heat treatment for the color filter after forming the planarized layer is attributable to the occurrence of the micro-cracks in the planarized layer. Further, as a result of proceeding the study for reducing the thermal stress, it has been found that the heat treatment temperature upon forming the color filter is excessively high. The present invention has been accomplished as a result of such studies.

SUMMARY OF THE INVENTION

An object of the present invention is to provide a method of forming a color filter used for a solid-state image sensing device in which a color filter comprising a resist material is formed on a planarized layer comprising a thermosetting resin formed on the surface of the solid-state image sensing device, and which can prevent occurrence of micro-cracks in the planarized layer comprising the thermosetting resin.

The foregoing object of the present invention can be attained by a method of forming a color filter used for a solid-state image sensing device in which a temperature of a heat treatment upon forming a color filter is equal to or higher than 205° C. and lower than 220° C.

In accordance with the method of forming the solid-state image sensing device described above, failures caused by cracks in the planarized layer can be decreased remarkably. Specifically, cracking failure is always caused if the temperature for heat treatment is at 220° C., but the thermal stress is reduced and the cracking failure is reduced remarkably as the temperature is lowered than 220° C.

By the way, a lower temperature for the heat treatment is better in view of decreasing the micro-cracks but there is a limit on the lowering of the temperature. This is because the naturally patterned differently depending on every colors which is conducted by exposure, development and heat treatment and residues after the development are increase as the heat treatment temperature is lowered. Specifically, the residue is increased remarkably at a temperature lower than 205° C. which is not acceptable. Then, if the heat treatment temperature upon forming the color filter is defined as equal or higher than 205° C. and lower than 220° C., occurrence of micro-cracks in the planarized layer can be prevented with no increase of residues.

DESCRIPTION OF THE PREFERRED EMBODIMENT

The method of forming the color filter of the solid-state image sensing device according to the present invention comprises a resist material on a planarized layer material comprising a thermosetting resin formed on the surface of a solid-state image sensing device, wherein a temperature for a heat treatment upon forming the color filter is defined as equal to or higher than 205° C. and less than 220° C. In the present invention, the solid-state image sensing device has no particular restriction of the type may be a CCD type, MOS type or an amplification type. Further, any color filter may be used so long as it is made of a resist material. The planarized layer is made of a thermosetting resin and an acrylic thermosetting resin can be mentioned as an example, with no particular restriction thereto. The present invention is applicable to solid-state image sensing devices with or without an on-chip micro lens.

BRIEF DESCRIPTION OF THE DRAWINGS

FIG. 3 is a graph showing the result of an experiment, in which an abscissa (axis X) denotes a baking temperature and an ordinate (axis Y) denotes a number of pixels each with black dot in a solid-state image sensing device.

EXAMPLE

Figure 1A:
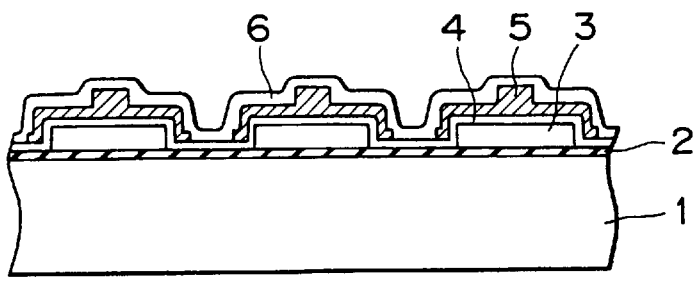
FIGS. 1A to 1D shows cross sectional views illustrating a first embodiment for a method of a forming a color filter for use in a solid-state image sensing device in the order of steps according to the present invention.

The present invention will be explained in more details in accordance with a preferred embodiment shown in the drawings. FIGS. 1A to 1D shows cross sectional view of a first example for the method of forming a color filter used in a color solid-state image sensing device according to the present invention in the order of steps.

(A) FIG. 1A shows a solid-state image sensing device in a state before forming a planarized layer. In the drawing, 1 denotes a semiconductor substrate. Since the structure has no direct concern with a feature of the present invention, the structure is neither illustrated nor explained. There are also shown a gate insulated film 2 on the surface of the substrate 1 and a vertical transfer electrode 3 composed of polysilicon and formed on the gate insulated film 2. There are also shown an interlayer insulation film 4, a light screening film 5, for example, made of aluminum and a passivation film 6 covering the surface of the device.

Figure 1B:
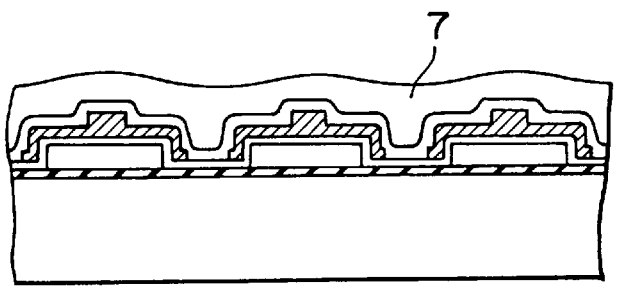

(B) Then, as shown in FIG. 1B, a planarized layer 7 comprising a thermosetting resin is formed on the passivation layer 6. The solid-state image sensing device has a remarkable surface unevenness and, naturally, the passivation layer 6 covering thereof also has remarkable surface unevenness. Therefore, since it is difficult to directly form the color filter on the layer 6 with no trouble, the planarized layer 7 is formed for flattening the surface.

The planarized layer 7 is formed specifically by coating (spin coating) a thermosetting resin, for example, an acrylic thermosetting resin and then curing the same by a heat treatment at a temperature, for example, of 230° C.

Figure 1C:
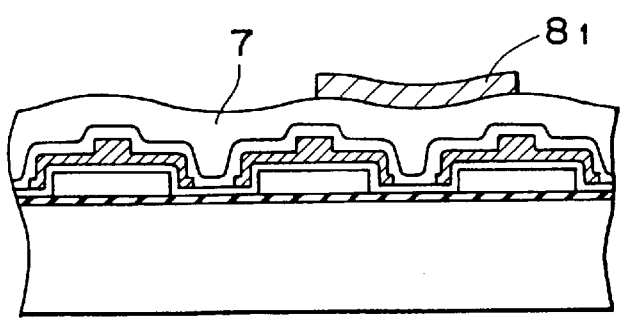

(C) Then, as shown in FIG. 1C, a first color filter $8_1$ is formed. The color filter $8_1$ is formed by coating a color resist colored to a certain color and then applying exposure and development and, subsequently, applying heat treatment so as to enhance adhesion with the underlying layer. Then, the temperature for the heat treatment is equal to or higher than 205° C. and less than 220° C., for example, 216° C.

Figure 1D:
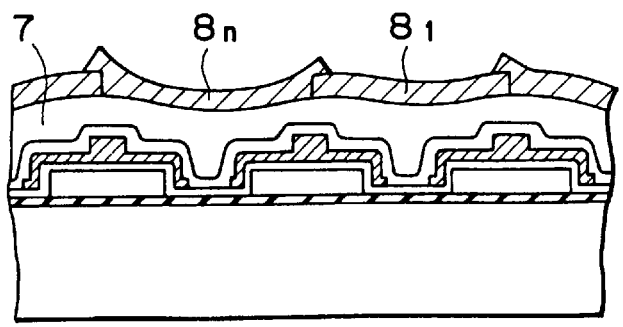

(D) Then, the same step as the step in (C) is repeated by several number as of times required. FIG. 1D shows a state upon forming the nth color filter. Color filters $8_2$–$8_n$ to be formed after the first color filter $8_1$ (color filter formed by the step of FIG. 1C) are also formed by the method quite identical with that for the first color filter $8_1$, and the temperature for the heat treatment for enhancing the adhesion with the underlying layer is defined as equal to or higher than 205° C. and less than 220° C., for example, 216° C.

Figure 2:
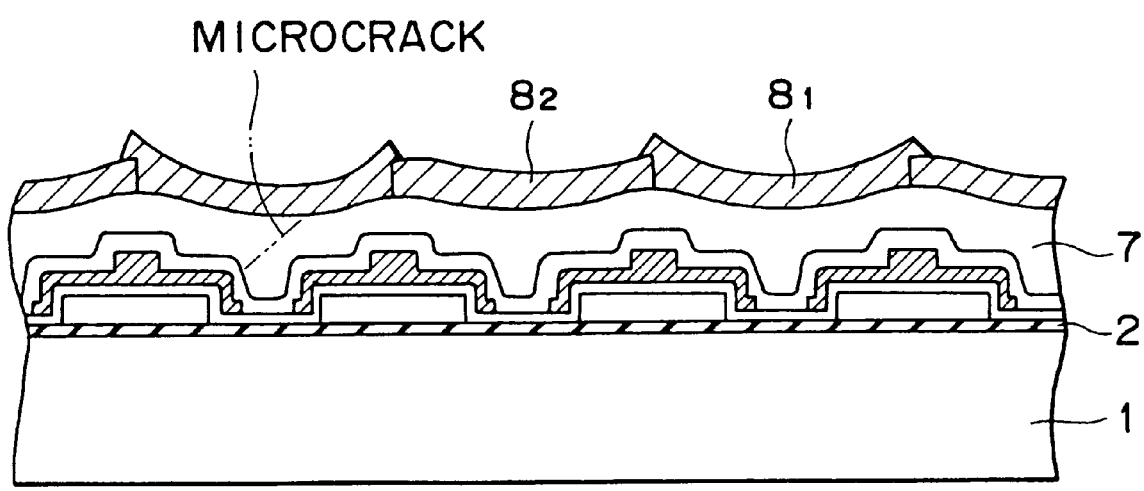
FIG. 2 is a cross sectional view illustrating a state after the formation of the color filter by the method of forming the color filter for use in the solid-state image sensing device.

FIG. 2 is a cross sectional view illustrating the state after forming the color filter. Cracking failures in the planarized layer were occurred at a rate as high as 40 to 80%, the failure rate could be decreased to 1% or lower by the method of forming the color filter for use in the solid-state image sensing device according to the present invention.

FIG. 3 is a graph showing the result of an experiment, in which an abscissa (axis X) denotes a baking temperature and an ordinate (axis Y) denotes the number of pixels with black dots in a solid-state image sensing device. In the figure, the solid line indicates the number of pixels (axis Y1) having black dots caused by cracks, while the dotted line denotes the number of pixels (axis Y2) having black dots caused by residues. As apparent from the graph, in this experiment, black dots are scarcely formed pixels within a temperature range equal to or higher than 205° C. and lower than 210° C. and only allowable amount of black dots are formed within a temperature range equal to or higher than 210° C. and lower than 220° C. in this experiment. However, it can be seen that there are remarkably formed black dots caused by the residues at a temperature lower than 205° C. and black dots caused by the cracks at a temperature equal to or higher than 220° C.

Namely, if the temperature for the heat treatment of the color filter 8 is set to 220° C. or higher, cracking failure always occurred, whereas the thermal stress is decreased and the cracking failure is decreased as the temperature is lowered below the level as described above. Then, the lower temperature for the heat treatment is better in view of decrease of the micro-cracks but lowering of the temperature is limited in view of the residues after the development and a temperature lower than 205° C. is not allowable because the residues increase remarkably. Accordingly, occurrence of micro-cracks in the planarized layer can be prevented without increasing the residues after the development, by defining the heat treatment temperature to a level equal to or higher than 205° C. and less than 220° C.

The present invention is applicable not only to the formation of a color filter, but also to the formation of a black and white filter. Further, the present invention is applicable not only to an on-chip filter of a solid-state image sensing device but also to a liquid crystal display device.

According to the method of forming the color filter of the solid-state image sensing device of the present invention, the thermal stress in the planarized layer upon forming the color filter can be decreased with no problem of the residues after the development of the color filter, thereby enabling to prevent occurrence of the micro-cracks in the planarized layer to reduce the failure rate due to the cracks.

Specifically, the failure rate caused by the cracks in the planarized layer which was as high as 40 to 80% can be reduced to 1% or less.

What is claimed is:

1. A method of forming an on-chip filter comprising a step of forming a planarized layer made of a thermosetting resin on the surface of a device and a step of coating a resist material on the planarized layer and, subsequently, applying a heat treatment at a temperature equal to or higher than 205° C. and less than 220° C., wherein the thermosetting resin is an acrylic resin.

2. A method of forming an on-chip filter as defined in claim 1, wherein the on-chip filter is a color filter.

3. A method of forming a solid-state image sensing device comprising a step of forming a planarized layer made of a thermosetting resin on the surface of a solid-state image sensing device and a step of coating a resist material on the planarized layer and, subsequently, applying a heat treatment at a temperature equal to or higher than 205° C. and less than 220° C., wherein the thermosetting resin is an acrylic resin.

4. A method of forming a solid-state image sensing device as defined in claim 3, wherein the filter is a color filter.

\* \* \* \* \*